US011568953B2

(12) United States Patent
Hanna

(10) Patent No.: US 11,568,953 B2
(45) Date of Patent: *Jan. 31, 2023

(54) ELECTRICAL DEVICE WITH TEST INTERFACE

(71) Applicant: Micron Technology, Inc., Boise, ID (US)

(72) Inventor: Stephen Hanna, Fort Collins, CO (US)

(73) Assignee: Micron Technology, Inc., Boise, ID (US)

( * ) Notice: Subject to any disclaimer, the term of this patent is extended or adjusted under 35 U.S.C. 154(b) by 83 days.

This patent is subject to a terminal disclaimer.

(21) Appl. No.: 17/152,352

(22) Filed: Jan. 19, 2021

(65) Prior Publication Data

US 2021/0142861 A1 May 13, 2021

Related U.S. Application Data

(63) Continuation of application No. 16/514,685, filed on Jul. 17, 2019, now Pat. No. 10,930,366.

(51) Int. Cl.
*G11C 29/48* (2006.01)
*G06F 13/16* (2006.01)

(52) U.S. Cl.
CPC .......... *G11C 29/48* (2013.01); *G06F 13/1668* (2013.01)

(58) Field of Classification Search
CPC ........................... G11C 29/48; G06F 13/1668
See application file for complete search history.

(56) References Cited

U.S. PATENT DOCUMENTS

| 6,825,683 | B1 | 11/2004 | Berndt et al. |
| 2001/0021903 | A1* | 9/2001 | Ryu ........................ G06F 30/33 703/22 |
| 2003/0212968 | A1* | 11/2003 | Nightingale ............ G06F 30/33 716/117 |
| 2004/0059965 | A1 | 3/2004 | Marshall et al. |
| 2008/0294929 | A1 | 11/2008 | Tune et al. |
| 2009/0179785 | A1 | 7/2009 | Lee et al. |
| 2014/0229785 | A1 | 8/2014 | Barakat et al. |
| 2015/0169394 | A1 | 6/2015 | Parthasarathy et al. |

(Continued)

FOREIGN PATENT DOCUMENTS

| CN | 104685465 A | 6/2015 |
| CN | 108806762 A | 11/2018 |

OTHER PUBLICATIONS

CN Notification to Grant Patent Right for Invention for CN Application No. 202010694237.X, dated Jan. 6, 2022, 4 pages.

(Continued)

*Primary Examiner* — Kyle Vallecillo

(74) *Attorney, Agent, or Firm* — Lowenstein Sandler LLP

(57) ABSTRACT

An example system comprises: a master bus electrically coupled to a master multiplexer controlled by a test mode signal selecting between a master physical interface (PHY) and a slave bus of a plurality of slave buses, wherein each slave bus is electrically coupled to a respective slave multiplexer selecting between a respective slave PHY and the master bus; a plurality of electrical circuits, wherein each electrical circuit of the plurality of electrical circuits is electrically coupled to one of: the master bus or a slave bus of the plurality of slave buses; and a memory test interface electrically coupled to the master bus.

20 Claims, 4 Drawing Sheets

(56) References Cited

U.S. PATENT DOCUMENTS

2016/0292123 A1* 10/2016 Higuchi .............. G06F 13/4018
2018/0246796 A1   8/2018 Pappu
2018/0373582 A1 12/2018 Yamashita
2019/0236276 A1   8/2019 Hershman et al.

OTHER PUBLICATIONS

USPTO, Notice of Allowance for U.S. Appl. No. 16/514,685, dated Oct. 22, 2020.
CN Office Action for Application No. 202010694237.X, dated Jun. 15, 2021.
Jedec Standard, "Universal Flash Storage (UFS) Test, Version 1.1, JESD224A", https://www.jedec.org/document_search?search_api_views_fulltext=jesd224, 292 pages, Jul. 2017.
ONFI Open Nand Flash Interface, "Open NAND Flash Interface Specification", http://www.onfi.org/-/media/client/onfi/specs/onfi_4_1_gold.pdf?la=en, 338 pages, Revision 4.1, Dec. 12, 2017.

* cited by examiner

ELECTRICAL DEVICE WITH TEST INTERFACE

RELATED APPLICATIONS

This application is a continuation of U.S. patent application Ser. No. 16/514,685 filed on Jul. 17, 2019, which is incorporated by reference herein.

TECHNICAL FIELD

Embodiments of the disclosure relate generally to memory sub-systems, and more specifically, relate to managing a memory sub-system including memory components with different characteristics.

BACKGROUND

A memory sub-system can be a storage system, such as a solid-state drive (SSD), or a hard disk drive (HDD). A memory sub-system can be a memory module, such as a dual in-line memory module (DIMM), a small outline DIMM (SO-DIMM), or a non-volatile dual in-line memory module (NVDIMM). A memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
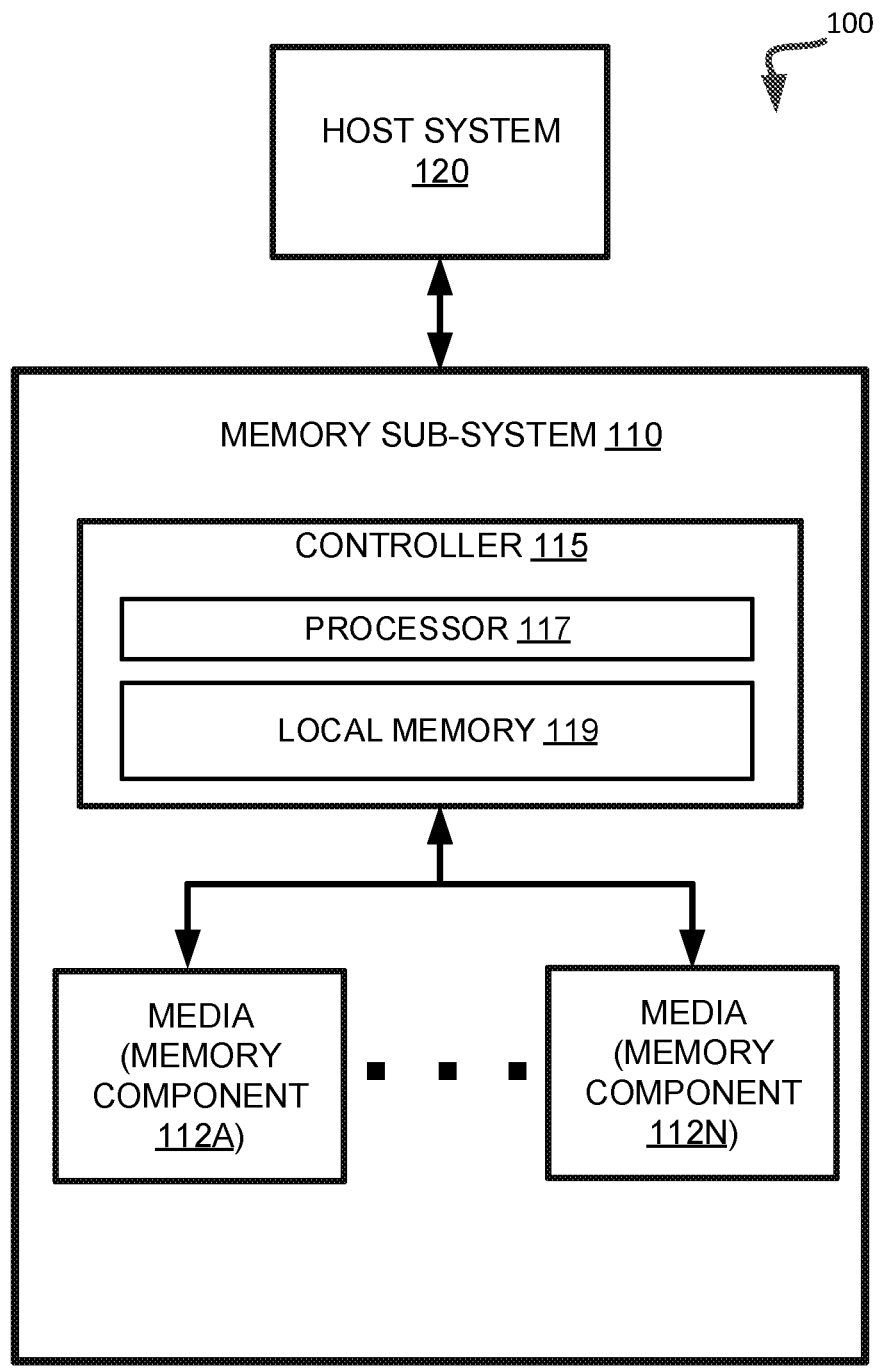
FIG. 1 illustrates an example computing environment that includes a memory sub-system in accordance with some embodiments of the present disclosure.

Aspects of the present disclosure are directed to a storage device with a test interface. A memory sub-system may include a storage device that is coupled to a central processing unit (CPU) via a peripheral interconnect (e.g., an input/output bus, a storage area network). Examples of storage devices include a solid-state drive (SSD), a flash drive, a universal serial bus (USB) flash drive, and a hard disk drive (HDD). Another example of a memory sub-system is a memory module that is coupled to the CPU via a memory bus. Examples of memory modules include a dual in-line memory module (DIMM), a small outline DIMM (SO-DIMM), a non-volatile dual in-line memory module (NVDIMM), etc. In some embodiments, the memory sub-system can be a hybrid memory/storage sub-system. In general, a host system can utilize a memory sub-system that includes one or more memory components. The host system can provide data to be stored at the memory sub-system and can request data to be retrieved from the memory sub-system.

Implementations of the present disclosure are related to storage devices, such as negative-AND (NAND) flash storage devices, with test interfaces. NAND flash storage devices support different type of media, including single-level cell (SLC), multilevel cell (MLC), triple-level cell (TLC) and quad-level cell (QLC), and are available in various densities. Low-density NAND flash may be employed for applications such as set-top boxes (STBs), digital televisions (DTVs), and digital signal controllers (DSCs), while high-density NAND flash is commonly used in data-heavy applications like solid state drives (SSDs), tablets, and USB drives. A NAND flash storage device may be managed by a controller, either internal or external, which may perform error code correction (ECC), bad block management, and wear leveling. There are two primary types of NAND: raw and managed. Raw NAND requires an external controller, but demonstrates the lowest cost per a unit of memory. Conversely, managed NAND includes an embedded controller to handle wear leveling, bad block management and ECC, and thus provide simpler design solutions and a better time-to-market. Managed NAND devices are commonly used in smartphones, tablets, and other similar portable computing devices.

Examples of managed NAND devices include eMultiMediaCard (eMMC) devices, on-die ECC NAND devices, SSDs, embedded USB devices, Universal Flash Storage (UFS) devices, Secure Digital Card (SD) and Micro SD/USB devices, as well as multichip packages (MCPs). In particular, eMMC devices are high-capacity NAND flash devices combined with a high-speed MMC controller in a single package. Such devices are commonly used in a wide range of networking, industrial, and automotive applications. On-die ECC NAND devices are hybrid devices of raw and fully managed NAND; ECC is integrated while wear leveling and bad block management are handled by the host controller. SSDs are NAND-based drives that enhance reliability, reduce power, and provide faster performance compared to hard disk drives (HDDs). Embedded USB devices bring the density and reliability of an SSD to networking and embedded applications with a simple USB connector. Universal Flash Storage (UFS) devices have a high-performance storage interface for applications that require faster sequential and random performance over eMMC with low power consumption. Secure Digital Card (SD) and Micro SD/USB devices are commonly used for applications that require flash memory to be easily removed or installed. NAND flash memory is also commonly used in MCPs where it is paired with Mobile LPDRAM in a variety of form factors.

Endurance of the storage media is an important characteristic of flash memory devices. When data is written to and/or erased from a memory cell of a memory component, the memory cell may be damaged. As the number of write operations and/or erase operations performed on a memory cell increases, the probability that the data stored at the memory cell including an error increases as the memory cell is increasingly damaged. A characteristic associated with the endurance of the memory component is the number of write operations or a number of program/erase operations performed on a memory cell of the memory component. If a threshold number of write operations performed on the memory cell is exceeded, then data can no longer be reliably stored at the memory cell as the data can include a large number of errors that cannot be corrected.

Accordingly, an important feature of a managed NAND device is the ability to electrically isolate the NAND memory components from the controller in order to directly query the NAND memory components, e.g., to facilitate identification of a single faulty NAND memory component. In an illustrative example, testing a storage device may involve iterating through all memory components in order to directly query each memory component. Querying an individual memory component may involve performing one or more cycles of writing a test data pattern, reading the data back and comparing the data read from the memory component to the test data pattern that was written to the memory component. A difference between the data read from the memory component and the test data pattern may indicate that the memory component is faulty.

In common implementations, the managed NAND device may be provided by a system-on-chip or an integrated circuit, all the components of which are located on a single substrate having a standard form factor. Accordingly, additional test pins for accessing the internal bus of the managed NAND device in the test mode are placed on the substrate and may be connected to a test equipment (e.g., a personal computer equipped with an adapter supporting the requisite bus protocol). However, latest managed NAND specifications (such as UFS 3.0/4.0) require support of multiple internal buses (e.g., up to four buses) for connecting to NAND memory components. Accordingly, placing the requisite number of test pins and routing their connections to multiple internal buses may present a design challenge in view of the limited physical dimensions of the substrate.

Aspects of the present disclosure address the above and other deficiencies by providing a memory sub-system including a storage device (such as a managed NAND device) with a test interface, in which one internal bus of the managed NAND device is designated as the master bus, while other internal buses are designated as slave buses. The buses are interconnected via bus multiplexers, thus allowing a single set of test pins connected to the maser bus to be utilized for accessing all memory components.

Thus, only the master bus is equipped with a set of test pins which support the requisite signals, including Address Latch Enable (ALE), Chip Enable (CE #), Command Latch Enable (CLE), Data Strobe (DQS), Data (DQx), Read Enable (RE #), Write Enable (WE), and/or Ready/Busy (R/B #), etc. A bus multiplexer is connected to each of the buses, such that the master bus multiplexer selects between the physical interface (PHY) of the master bus and one of the slave buses, while each slave bus multiplexer selects between a respective PHY of the slave bus or the master bus. The multiplexers are controlled by a test mode signal, which thus controls which of the buses is connected to the test pins. In addition, the bus directions (read/write) are controlled by a direction signal, as described in more detail herein below with references to FIGS. 1-2.

Utilizing bus multiplexing for providing a test interface may resolve the above-referenced design challenges related to the need to place the requisite number of test pins on the limited surface of the substrate. Furthermore, utilizing the bus multiplexing may result in a reduced device cost and power consumption due to limiting the energy dissipation by reducing the routing paths.

FIG. 1 illustrates an example computing system 100 that includes a memory sub-system 110 in accordance with some embodiments of the present disclosure. The memory sub-system 110 can include storage media, such as memory components 112A to 112N. The memory components 112A to 112N can be volatile memory components, non-volatile memory components, or a combination of such. In some embodiments, the memory sub-system is a storage device, such as a managed NAND device. In some embodiments, the memory sub-system 110 is a hybrid memory/storage sub-system. In general, the computing system 100 can include a host system 120 that uses the memory sub-system 110. For example, the host system 120 can write data to the memory sub-system 110 and read data from the memory sub-system 110.

The host system 120 can be a computing device such as a desktop computer, laptop computer, network server, mobile device, or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative-and (NAND) type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 120. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write inplace operation, where a non-volatile memory cell can be programmed without the non-volatile memory cell being previously erased. Furthermore, the memory cells of the memory components 112A to 112N can be grouped as memory pages or data blocks that can refer to a unit of the memory component used to store data.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 may not include a controller 115, and may instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory components 112A to 112N.

In certain implementations, the memory sub-system may be represented by a managed NAND storage device that may be implemented as a single integrated circuit (or a system-on-chip), in which all components, including the memory components 112A-112N and the controller 115 are located on a single substrate having a standard form factor, as described in more detail herein below with reference to FIG. 2. In various illustrative examples, the storage device may support a standard physical interface and pin assignments, e.g., 48-pin TSOP or 48-pin WSOP packaging for 8-bit or 16-bit data access.

Figure 2:
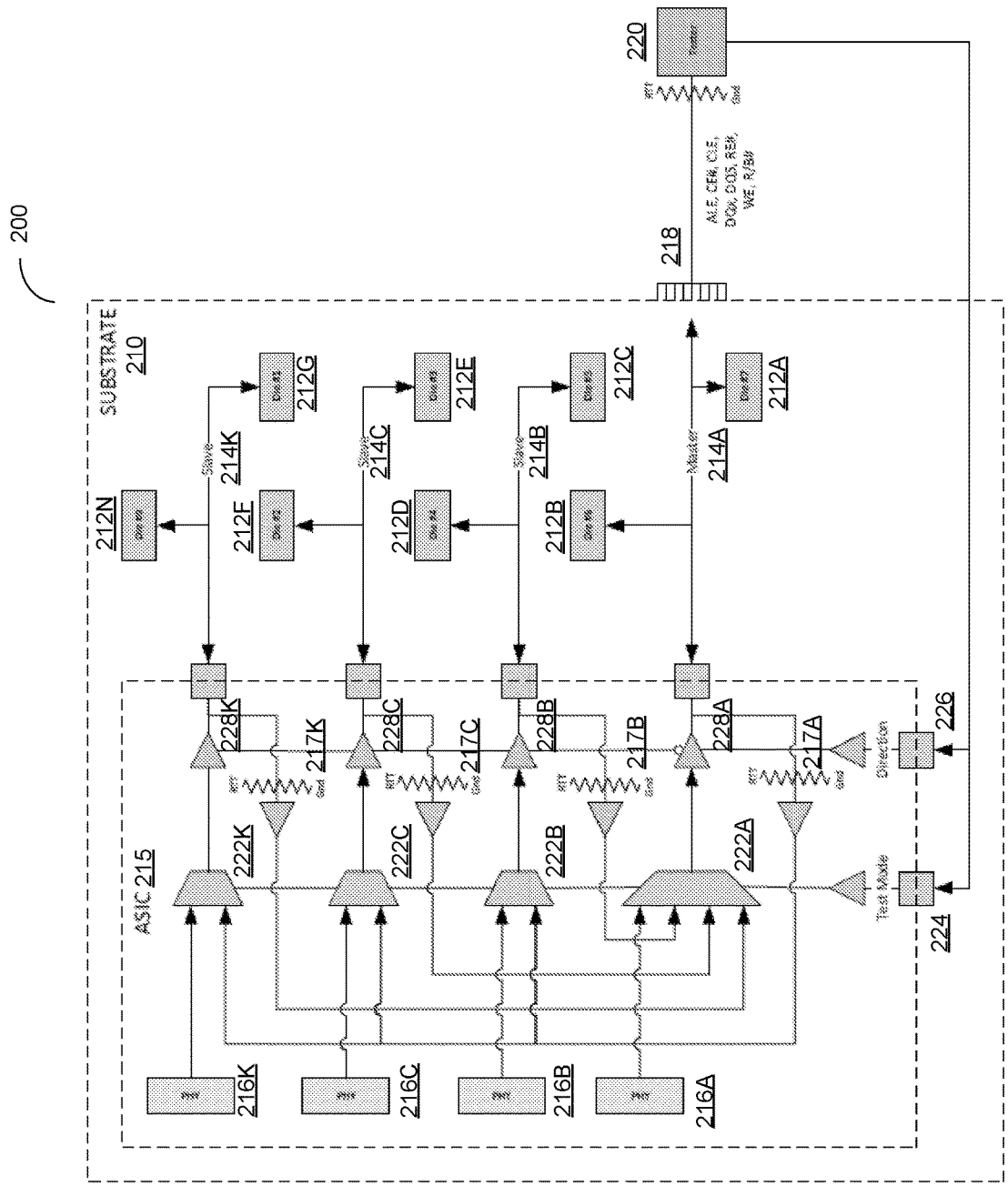
FIG. 2 illustrates an example storage device (e.g., a managed NAND device) with a test interface implemented in accordance with one or more aspects of the present disclosure.

FIG. 2 illustrates an example storage device 200 (e.g., a managed NAND device) with a test interface implemented in accordance with one or more aspects of the present disclosure. In the illustrative example of FIG. 2, the storage device 200 is implemented as a single integrated circuit (or a system-on-chip), all components of which are locate on a single substrate 210. The storage device 200 includes multiple memory components 212A-212N, each of which may include one or more arrays of memory cells, such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory components 212A-212N is electrically coupled to one of the buses 214A-214K. The bus 214A is designated as the master bus, while the buses 214B-214K are designated as slave buses. While four buses are shown in the illustrative example of FIG. 2, of which three buses are designated as slave buses, other implementations of this disclosure may include various other numbers of slave buses which are interconnected to the master bus in the manner shown in FIG. 2.

The storage device 200 may further include an application-specific integrated circuit (ASIC) 215, which may implement various memory controller functions, such as ECC, bad block management, wear leveling, and/or other functions directed to supporting a requisite memory access protocol at the physical interfaces (PHYs) 216A-216K. It should be noted that the circuitry employed for performing the memory controller functions is omitted from FIG. 2 for clarity and conciseness.

Each PHY 216A-216K is electrically coupled to a corresponding bus 214A-214K, such that the master bus 214A is electrically coupled to the master PHY 216A, while each of the slave buses is electrically coupled to a respective slave PHY 216B-216K. It should be noted that "master" and "slave" designations of the PHYs 216 are utilized herein solely for the purposes of simplifying the description when referring to the relationships between a bus and a corresponding PHY, while all the PHYs, irrespective of their "master" and "slave" designation, may be physically implemented in a similar manner.

In order to prevent undesirable signal reflection in the buses, each of the buses may be electrically coupled to the ground via a terminating resistor matching the characteristic impedance of the bus. In particular, the master bus 212A may be electrically coupled to the ground via the master bus terminating resistor 217A, while each slave bus 212B-212K may be electrically coupled to the ground via a respective slave bus terminating resistor 217B-217K.

The master bus 214A may be electrically coupled to the test interface 218, which may include a plurality of pins located on the substrate for connecting to the testing equipment 220 (e.g., a personal computer equipped with an adapter supporting the requisite bus protocol). It should be noted that the test equipment 220 does not constitute an integral part of the storage device 200 and as such is shown in FIG. 1 for reference purposes only, in order to illustrate the functional designation of the test interface 218. The test pins of the test interface 218 may support various requisite signals, including Address Latch Enable (ALE), Chip Enable (CE #), Command Latch Enable (CLE), Data Strobe (DQS), Data (DQx), Read Enable (RE #), Write Enable (WE), and/or Ready/Busy (R/B #).

The ALE and CLE signals may be utilized by the host to indicate the type of the bus cycle (command, address, or data). The CE # signal may be utilized by the host to select the target: when CE # is high and the target is in the ready state, the target goes into a low-power standby state; when CE # is low, the target is selected. The WE signal may be utilized by the host to control the latching of commands, addresses, and input data: data, commands, and addresses are latched on the rising edge of WE. The DQS signal may indicate the data valid window. The DQx signal is captured on the edges of DQS, and may be used in some data interfaces. The RE # signal enables serial data output. The R/B # signal indicates the target status: when low, the signal indicates that one or more logical unit number (LUN) operations are in progress.

As noted herein above, the storage device 200 should be able to electrically isolate the memory components 212A-212N from the PHYs 216A-216K in order to directly query the memory components, e.g., to facilitate identification of a single faulty memory component 212. In an illustrative example, testing the storage device 200 may involve iterating through all memory components 212A-212N in order to directly query each memory component. Querying an individual memory component 212A-212N may involve performing one or more cycles of writing a test data pattern, reading the data back and comparing the data read from the memory component to the test data pattern that was written to the memory component. A difference between the data read from the memory component and the test data pattern may indicate that the memory component is faulty.

Accordingly, in order to enable access to a selected memory component 212A-212N through the test interface 218 while isolating the PHYs 216A-216K, each bus 214A-214K is electrically coupled to a respective multiplexer 222A-222K, which is controlled by a test mode signal 224 to enable an electric path between the selected memory component 212A-212N and the test interface 218. In particular, the master bus 214A is electrically coupled to the K:1 multiplexer 222A, where K is the total number of buses in the storage device 200. Accordingly, the master bus multiplexer 222A, controlled by the test mode signal 224, is employed to select whether the master PHY 216A or one of the slave buses 214B-214K is coupled to the master bus 214A.

Similarly, each slave bus 214B-214K is electrically coupled to a respective 2:1 multiplexer 222B-222K. Each slave bus multiplexer, e.g., multiplexer 222B, controlled by the test mode signal 224, is employed to select whether the master bus 214A or the respective slave PHY 216B is coupled to the slave bus 214B.

Furthermore, the buses 214A-214K are controlled using the direction signal 226 and respective direction control elements (e.g., diodes or thyristors) 228A-228K in order to select the direction of the data transfer (to or from the selected memory component 212). The direction signal supplied to the master bus 214A is inverted with respect to the direction signals supplied to each of the slave buses 214B-214K, thus ensuring that the master bus 214A and the selected slave bus 214B-214K operate in the opposite directions, i.e., for reading data from a memory component 212 connected to a slave bus 214B-214K, the bus direction of the slave bus 214B-214K is set in such a way that the data being read from the selected memory component is fed through the slave bus to the master multiplexer 222A, and then through the master bus 212A to the test interface 218. Conversely, for writing data to a memory component 212 connected to a slave bus 214B-214K, the bus direction of the master bus 214A is set in such a way that the data being read from the test interface 218 is fed through the master bus 214A to the selected slave bus 214B-214K via the respective slave bus multiplexer 222B-222K. The bus cycles are asserted accordingly using the appropriate chip enable (CE #) signal to read/write data from/to the selected memory component 212.

For example, for reading data from the memory component 212C connected to the slave bus 214B, the bus direction of the slave bus 214B is set in such a way that the data being read from the memory component 212C is fed through the slave bus 214B to the master multiplexer 222A, and then through the master bus 212A to the test interface 218. In another example, for writing data to the memory component 212E connected to the slave bus 214C, the bus direction of the master bus 214A is set in such a way that the data being read from the test interface 218 is fed through the master bus 214A to the selected slave bus 214c via the slave bus multiplexer 222C.

Figure 3:
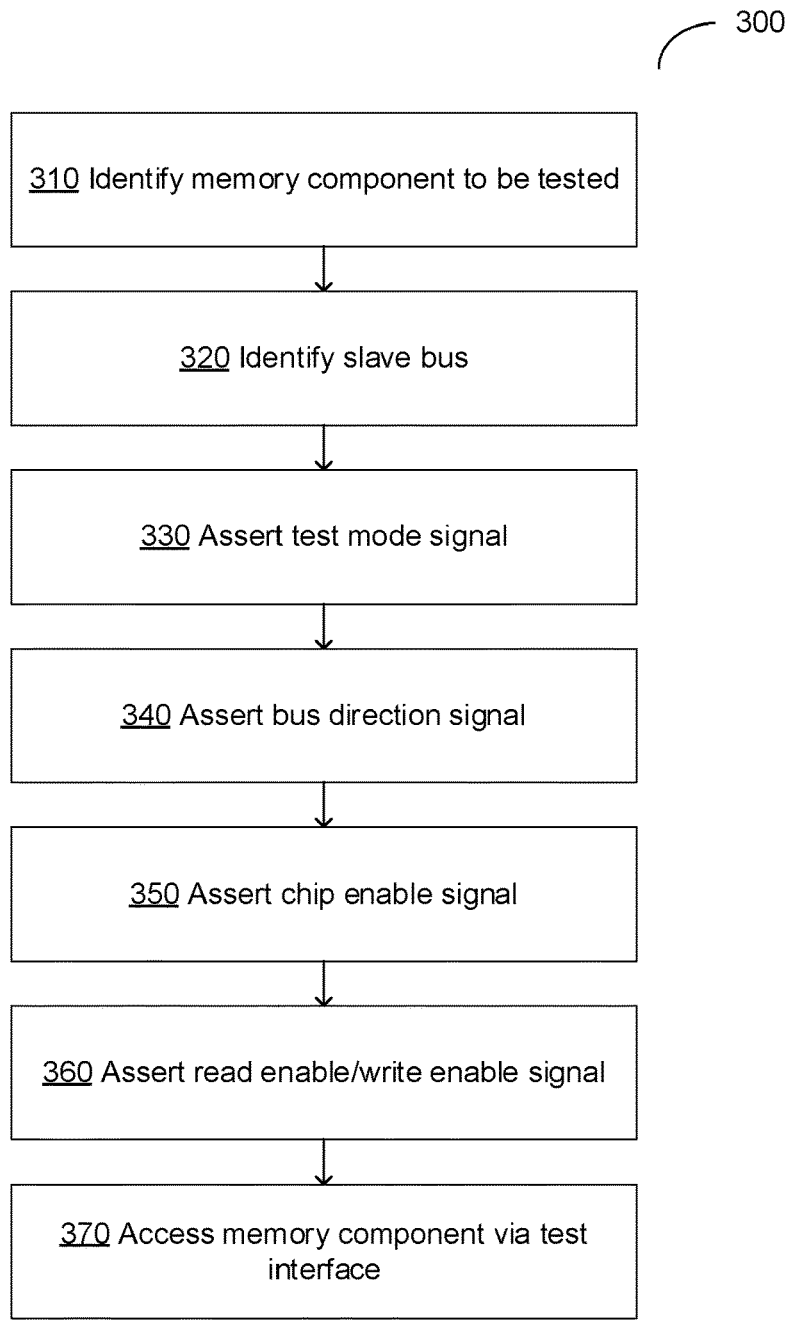
FIG. 3 is a flow diagram of an example method of accessing memory components of a memory sub-system (e.g., a storage device) in the test mode, in accordance with some embodiments of the present disclosure.

FIG. 3 is a flow diagram of an example method 300 of accessing memory components of a storage device in the test mode, in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the testing equipment 220 of FIG. 2. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 310, a computer system implementing the method may identify, among a plurality of memory components of a storage device to be tested, a memory component to be accessed via the test interface. As noted herein above, the storage device supports directly querying of its memory components, e.g., in order to facilitate identification of a single faulty memory component. Accordingly, in an illustrative example, testing the storage device may involve iterating through all memory components in order to directly query each of them, e.g., by performing one or more cycles of writing a test data pattern, reading the data back and comparing the data read from the memory component to the test data pattern that was written to the memory component. A difference between the data read from the memory component and the test data pattern may indicate that the memory component is faulty.

At operation 320, the computer system may identify, among a plurality of slave buses of the memory system, a slave bus to which the memory component of interest is electrically coupled. In an illustrative example, the bus number may be equal to the integer quotient of the memory component number and the number of memory components per bus.

At operation 330, the computer system may assert a test mode signal to force electrical coupling of the slave bus to the master bus. As noted herein above, the master bus is electrically coupled to a K:1 multiplexer, where K is the total number of buses in the storage device, such that the master bus multiplexer, controlled by the test mode signal, is employed to select whether the master PHY or one of the slave buses is coupled to the master bus. Similarly, each slave bus is electrically coupled to a respective 2:1 multiplexer, which is controlled by the test mode signal to select whether the master bus or the respective slave PHY is coupled to the slave bus.

At operation 340, the computer system may assert a bus direction signal to indicate a desired direction of data transfer (read or write data from/to the memory component of interest). As noted herein above, the direction signal supplied to the master bus is inverted with respect to the direction signals supplied to each of the slave buses, thus ensuring that the master bus and the selected slave bus operate in the opposite directions: for reading data from the memory component of interest, the bus direction of the slave bus to which the memory component is connected is set in such a way that the data being read from the memory component is fed through the slave bus to the master multiplexer, and then through the master bus to the test interface. Conversely, for writing data to the memory component of interest, the bus direction of the master bus is set in such a way that the data being read from the test interface is fed through the master bus, via the respective slave bus multiplexer, to the slave bus to which the memory component of interest is connected.

At operation 350, the computer system may assert, on the master bus, a chip enable (CE) signal to select the memory component of interest.

At operation 360, the computer system may assert, on the master bus, various signals to control the bus cycles. In an illustrative example, the computer system may asset a read enable (RE) signal or a write enable (WE) signal to select the desired data transfer operation.

At operation 370, the computer system may access the memory component via the test interface in order to perform the desired data transfer operation. Responsive to completing operation 360, the method may terminate.

Figure 4:
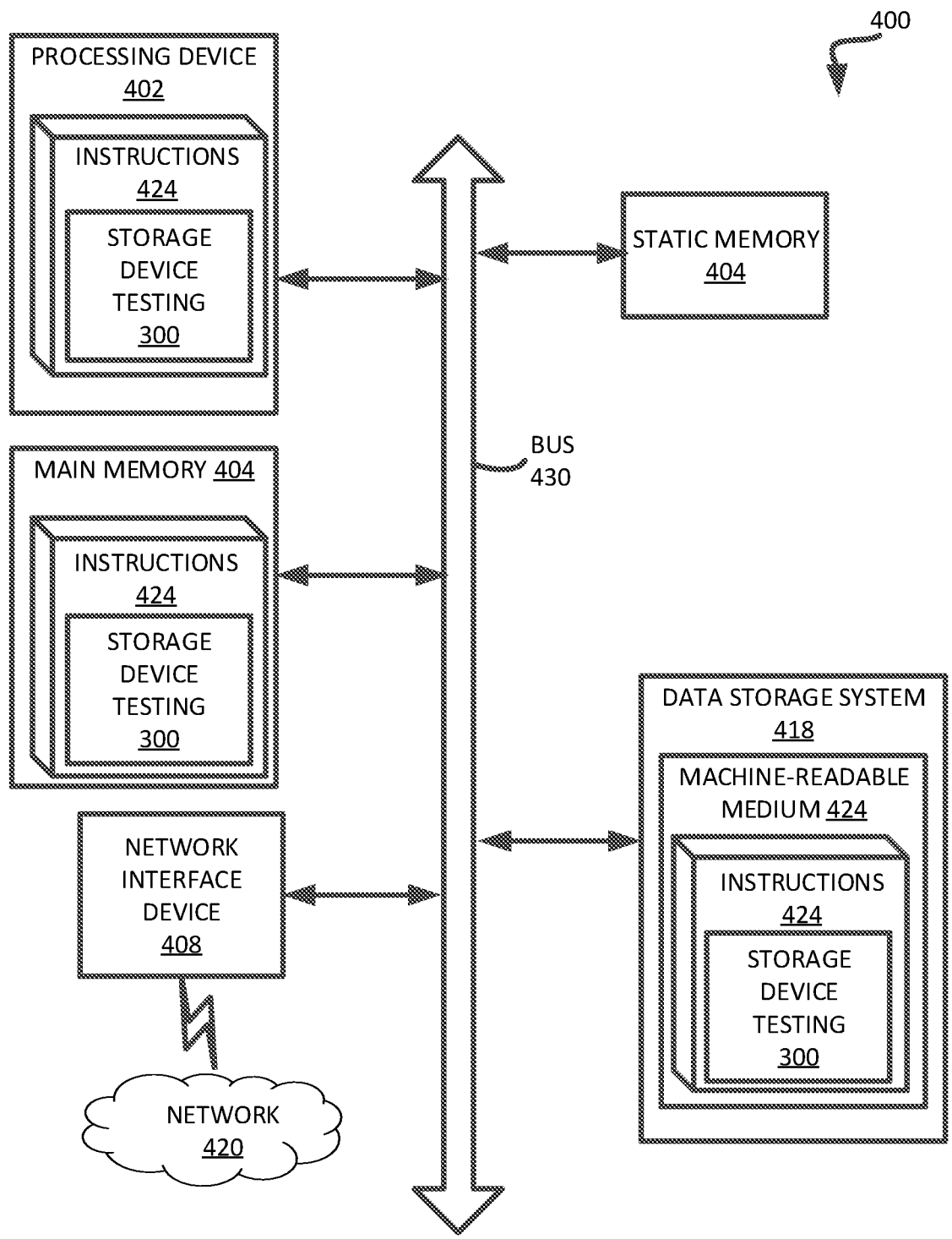
FIG. 4 is a block diagram of an example computer system in which embodiments of the present disclosure may operate.

FIG. 4 illustrates an example machine of a computer system 400 within which a set of instructions, for causing the machine to perform any one or more of the methodologies discussed herein, can be executed. In some embodiments, the computer system 400 can correspond to a host system (e.g., the host system 120 of FIG. 1) that includes, is coupled to, or utilizes a memory sub-system (e.g., the memory sub-system 110 of FIG. 1) or can be used to perform the operations of a test equipment (e.g., to execute an operating system to perform operations of the test equipment 220 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 400 includes a processing device 402, a main memory 404 (e.g., read-only memory (ROM), flash memory, dynamic random access memory (DRAM) such as synchronous DRAM (SDRAM) or Rambus DRAM (RDRAM), etc.), a static memory 404 (e.g., flash memory, static random access memory (SRAM), etc.), and a data storage system 418, which communicate with each other via a bus 430.

Processing device 402 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 402 can also be one or more special-purpose processing devices such as an application specific integrated circuit (ASIC), a field programmable gate array (FPGA), a digital signal processor (DSP), network processor, or the like. The processing device 402 is configured to execute instructions 424 for performing the operations and steps discussed herein. The computer system 400 can further include a network interface device 408 to communicate over the network 420.

The data storage system 418 can include a machine-readable storage medium 424 (also known as a computer-readable medium) on which is stored one or more sets of instructions 424 or software embodying any one or more of the methodologies or functions described herein. The instructions 424 can also reside, completely or at least partially, within the main memory 404 and/or within the processing device 402 during execution thereof by the computer system 400, the main memory 404 and the processing device 402 also constituting machine-readable storage media. The machine-readable storage medium 424, data storage system 418, and/or main memory 404 can correspond to the memory sub-system 110 of FIG. 1.

In one embodiment, the instructions 424 include instructions to implement functionality corresponding to a characteristic component (e.g., the characteristic component 113 of FIG. 1). While the machine-readable storage medium 424 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system, comprising:
   a master bus electrically coupled to a master multiplexer controlled by a test mode signal to select between a master physical interface (PHY) and a slave bus of a plurality of slave buses, wherein each slave bus is electrically coupled to a respective slave multiplexer to select between a respective slave PHY and the master bus;
   a plurality of electrical circuits, wherein each electrical circuit of the plurality of electrical circuits is electrically coupled to one of: the master bus or a slave bus of the plurality of slave buses; and
   a test interface electrically coupled to the master bus.

2. The system of claim 1, wherein the master bus further comprises a master direction control element controlled by a direction signal.

3. The system of claim 1, wherein each slave bus of the plurality of slave buses further comprises a respective slave direction control element controlled by a reversed direction signal.

4. The system of claim 1, wherein the master bus is electrically coupled to a ground via a master bus terminating resistor.

5. The system of claim 1, wherein each slave bus of the plurality of slave buses is electrically coupled to a ground via a respective slave bus terminating resistor.

6. The system of claim 1, wherein the test interface comprises a chip enable signal to select an electrical circuit of the plurality of electrical circuits.

7. The system of claim 1, wherein the test interface comprises at least one of: a read enable (RE) signal or a write enable (WE) signal.

8. The system of claim 1, further comprising:
   an application-specific integrated circuit (ASIC) electrically coupled to the master bus and the plurality of slave buses.

9. An integrated circuit, comprising:
   a substrate;
   a plurality of electrical circuits disposed on the substrate, wherein each electrical circuit of the plurality of electrical circuits is electrically coupled to one of: a master bus or a slave bus of a plurality of slave buses; and
   a test interface electrically coupled to the master bus, wherein the test interface comprises a test mode signal to manage selective electrical coupling of the master bus to one of: a master physical interface (PHY) or a slave bus of the plurality of slave buses, wherein each slave bus of the plurality of slave buses is selectively electrically coupled to one of: a respective slave PHY or the master bus.

10. The integrated circuit of claim 9, wherein the master bus is electrically coupled to a master multiplexer controlled by the test mode signal selecting between the master PHY and a slave bus of the plurality of slave buses.

11. The integrated circuit of claim 9, wherein each slave bus is electrically coupled to a respective slave multiplexer selecting between a respective slave PHY and the master bus.

12. The integrated circuit of claim 9, wherein the master bus further comprises a master direction control element controlled by a direction signal.

13. The integrated circuit of claim 9, wherein each slave bus of the plurality of slave buses further comprises a respective slave direction control element controlled by a reversed direction signal.

14. The integrated circuit of claim 9, wherein the test interface comprises a chip enable signal to select an electrical circuit of the plurality of electrical circuits.

15. The integrated circuit of claim 9, wherein the test interface comprises at least one of: a read enable (RE) signal or a write enable (WE) signal.

16. A method, comprising:
   identifying, among a plurality of electrical circuits, an electrical circuit to be accessed via a test interface electrically coupled to a master bus;
   identifying, among a plurality of slave buses of a storage device, a slave bus electrically coupled to the electrical circuit;
   asserting a test mode signal to manage electrical coupling of the slave bus to the master bus; and
   accessing the electrical circuit via the test interface.

17. The method of claim 16, wherein accessing the electrical circuit further comprises:
   asserting, on the master bus, a chip enable (CE) signal to select the electrical circuit.

18. The method of claim 16, wherein accessing the electrical circuit further comprises:
   asserting, on the master bus, at least one of: a read enable (RE) signal or a write enable (WE) signal.

19. The method of claim 16, wherein accessing the electrical circuit further comprises:
   asserting a bus direction signal to indicate a direction of data transfer.

20. The method of claim 16, wherein the electrical coupling of the slave bus to the master bus is performed by a slave bus multiplexer controlled by the test mode signal.

\* \* \* \* \*